United States Patent
Yotsuji (10) Patent No.: US 10,755,155 B2
(45) Date of Patent: Aug. 25, 2020

(54) FLAG RETAINING CIRCUIT AND FLAG RETAINING METHOD

(71) Applicant: LAPIS Semiconductor Co., Ltd., Yokohama (JP)

(72) Inventor: Tetsuaki Yotsuji, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/420,933

(22) Filed: May 23, 2019

(65) Prior Publication Data

US 2019/0362208 A1    Nov. 28, 2019

(30) Foreign Application Priority Data

May 24, 2018   (JP) .................................. 2018-99621

(51) Int. Cl.
*G06K 19/07* (2006.01)
*H02J 7/00* (2006.01)
*H03K 3/037* (2006.01)
*H02J 7/34* (2006.01)

(52) U.S. Cl.
CPC ........ *G06K 19/0709* (2013.01); *H02J 7/0068* (2013.01); *H02J 7/345* (2013.01); *H03K 3/0377* (2013.01)

(58) Field of Classification Search
CPC .................................................. G06K 19/0709
USPC ......................................... 235/492; 340/10.1
See application file for complete search history.

(56) References Cited

U.S. PATENT DOCUMENTS

| | | | |
|---|---|---|---|
| 2013/0186959 A1* | 7/2013 | Smith | G06K 19/0715 235/492 |
| 2016/0034728 A1* | 2/2016 | Oliver | G06K 7/10257 340/10.1 |
| 2017/0243032 A1* | 8/2017 | Pesavento | G06K 7/10297 |
| 2019/0362207 A1* | 11/2019 | Yotsuji | G06K 19/0723 |

FOREIGN PATENT DOCUMENTS

JP        2010109340 A       5/2010

* cited by examiner

*Primary Examiner* — Allyson N Trail
(74) *Attorney, Agent, or Firm* — Rabin & Berdo, P.C.

(57) ABSTRACT

A flag retaining circuit comprises a first capacitor element having one end connected to a first line and the other end grounded; a flag setting unit that charges the first capacitor element according to an input signal; a flag checking unit that outputs 0 or 1 based on the potential of the first capacitor element; and a discharging unit that discharges the first capacitor element. The discharging unit includes a transconductance element that discharges the first capacitor element via the first line; a control switch that receives supply of the voltage on a second line; and a second capacitor element having one end connected to a node between a control input end of the transconductance element and the control switch, and the other end grounded. The flag checking unit outputs the inverse of the voltage on the first line onto the second line.

10 Claims, 10 Drawing Sheets

FLAG RETAINING CIRCUIT AND FLAG RETAINING METHOD

BACKGROUND

1. Technical Field

The present invention relates to a flag retaining circuit and flag retaining method to retain a flag in an RFID tag.

2. Description of the Related Art

In these years, RFID (Radio Frequency Identification) technology is attracting attention where information is acquired from a tag in which the information such as ID (IDentification) is embedded using near field communication. An RFID radio communication system is composed of a tag in which information such as ID is embedded and a reader/writer that reads and writes information from and into the tag in a non-contact manner using radio waves. An RFID radio communication system using a passive-type tag that itself does not have a power source (hereinafter called passive-type RFID) is composed of a tag and a reader/writer that, while supplying electric power to the tag using radio waves, reads and writes information in a non-contact manner.

In the passive-type RFID, a persistence time is provided so that the tag retains a flag constituted by information of "0" or "1" for a certain time period (e.g., Japanese Laid-Open Patent Publication No. 2010-109340). For example, in an EPC™ global standard of the EPC (Electronic Product Code), session S1 defines that the flag is retained for 0.5 to 5 sec regardless of the presence or absence of power supply from the reader/writer to the tag.

SUMMARY

A tag of the passive-type RFID retains the flag by charge voltage of a capacitance (capacitor) provided in a flag retaining circuit. The flag retaining circuit is composed of a flag setting unit to set the flag of "0" or "1" by, e.g., charging the capacitance with electric charge, a flag checking unit to check the flag, and a discharging unit to discharge the capacitance. Charging the capacitance is performed when the flag setting unit sets the flag, and thereafter the discharging unit discharges the capacitance. A transconductance element and a control switch to become on or off according to a power-on reset signal are provided in the discharging unit. And the capacitance is discharged with use of a current into which the transconductance element converts a voltage determined by the state of the control switch.

The flag retention periods of the session S1 are defined as the same numerical value regardless of the presence or absence of power supply and is required to play the role of a timer. However, the signal level of the power-on reset signal is at a power-supply voltage ("H") level if there is power supply from the reader/writer and at a ground ("L") level if there is no power supply. If there is power supply, the control switch becomes on, so that discharge is performed with use of a constant current into which the transconductance element converts a stable voltage. In contrast, if there is no power supply, the control switch becomes off, so that the capacitance is discharged with use of a current into which the transconductance element converts a voltage gradually falling due to a leak current occurring through a parasitic diode of the control switch. Thus, the operation of the discharging unit changes depending on the presence or absence of power supply, and hence there is the problem that the length of the retention period also changes depending on the presence or absence of power supply. Further, there is the problem that, since it is difficult to make the timer have a constant retention period, the accuracy of the timer is low.

The present invention was made in view of the above problems, and an object thereof is to provide a flag retaining circuit which can retain a flag during a constant time period regardless of the presence or absence of power supply.

A flag retaining circuit according to the present invention is a flag retaining circuit in a tag circuit of RFID (Radio Frequency Identification) that receives power supply through radio waves from a reader/writer device, which transmits and receives information to and from said reader/writer device via near field communication, said flag retaining circuit retaining a flag having a value of 0 or 1 used in transmitting and receiving said information in response to flag setting action, comprising: a first capacitor element; a flag setting unit connected to a power source that supplies a power-supply voltage based on the power supply, for receiving supply of an input signal and charging said first capacitor element according to said input signal; a flag checking unit for outputting an output signal denoting 0 or 1 on the basis of the charge voltage across said first capacitor element; and a discharging unit for discharging said first capacitor element, wherein said first capacitor element is at one end thereof connected to a first line connecting said flag checking unit with said discharging unit, and at the other end thereof grounded, wherein said discharging unit includes: a transconductance element having a first output end grounded and a second output end connected to said first line, for converting a voltage supplied to a control input end thereof into a current flowing between said first output end and said second output end so as to discharge said first capacitor element via said first line; a control switch having a first end thereof connected to a node at a direct-current voltage, a second end thereof connected to the control input end of said transconductance element, and a control end thereof connected to a second line connecting said flag checking unit and said discharging unit, for connecting or disconnecting said first end with said second end depending on the voltage on said second line; and a second capacitor element at one end thereof connected to a node positioned between the control input end of said transconductance element and the second end of said control switch, and the other end thereof grounded, and wherein said flag checking unit outputs an inverse voltage obtained by inverting the voltage on said first line onto said second line.

A semiconductor circuit according to the present invention is comprising: a flag setting unit which is connected to a power source and to a first node, and for supplying a power-supply voltage generated by the power source to said first node or cutting off supply of said power-supply voltage in accordance with an input signal; a first capacitor element which is connected to said first node and is charged by said power-supply voltage; a flag checking unit which is connected to said first node, and for checking a flag based on the charge voltage across said first capacitor element; and a discharging unit which is connected to said first node, and for discharging said first capacitor element based on a signal outputted from said flag checking unit according to the charge voltage across said first capacitor element.

A flag retaining method according to the present invention is to be executed by a flag retaining circuit according to claim 1, including: the step of receiving power supply and said input signal supplied from said reader/writer device; the step of charging said first capacitor element according to said input signal; the step of outputting an output signal denoting 0 or 1 based on the charge voltage across said first capacitor element; and the step of discharging said first capacitor element according to change in a current flowing between said first output end and said second output end of said transconductance element.

The flag retaining circuit according to the present invention can retain a flag during a constant time period regardless of the presence or absence of power supply.

BRIEF DESCRIPTION OF THE DRAWINGS

Characteristics of the present invention will be described below with reference to the accompanying drawings.

DETAILED DESCRIPTION

Preferred embodiments of the present invention will be described in detail below. The same reference symbols are used to denote substantially the same or equivalent parts in the description below and the accompanying drawings.

A flag retaining circuit 100 of the present embodiment is mounted in a tag circuit of the RFID (Radio Frequency Identification). The tag circuit receives power supply from a reader/writer via near field communication. Thus, power supply is performed only when the tag circuit is located within a predetermined range from the reader/writer, and power supply is stopped when the tag circuit goes outside the predetermined range. In the description below, the case where there is power supply from the reader/writer is simply referred to as "power supply is present", and the case where there is no power supply from the reader/writer is simply referred to as "power supply is absent".

Further, in the tag circuit of the RFID, a flag for inventory needs to be set and retained over a predetermined time period in compliance with an EPC™ global standard of the EPC (Electronic Product Code). The retention period of the flag is specified for each session of S0, S1, S2, S3, and SL.

Figure 1:
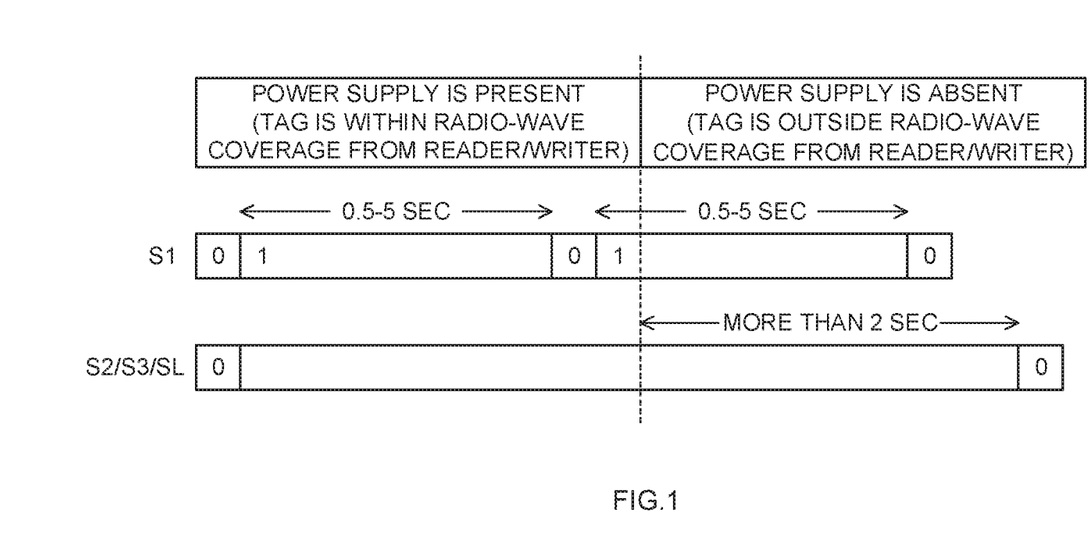
FIG. 1 is a diagram showing schematically the retention period of a flag for each session.

FIG. 1 is a diagram showing schematically the retention period of the flag for each of sessions S1, S2, S3, and SL. Here, illustration for session S0 is omitted.

In session S0, if power supply is absent, the flag need not be retained, and, if power supply is present, the flag always needs to be retained. In session S1, if the flag is set to "1", the flag of "1" must be retained over a predetermined time period of 0.5 to 5 sec regardless of the presence or absence of power supply. In contrast, in sessions S2, S3, and SL, if the flag is set to "1", the flag of "1" must be retained over a predetermined time period of more than two sec after power supply becomes absent.

The flag retaining circuit 100 of the present embodiment is a circuit retaining the flag in session S1.

Figure 2:
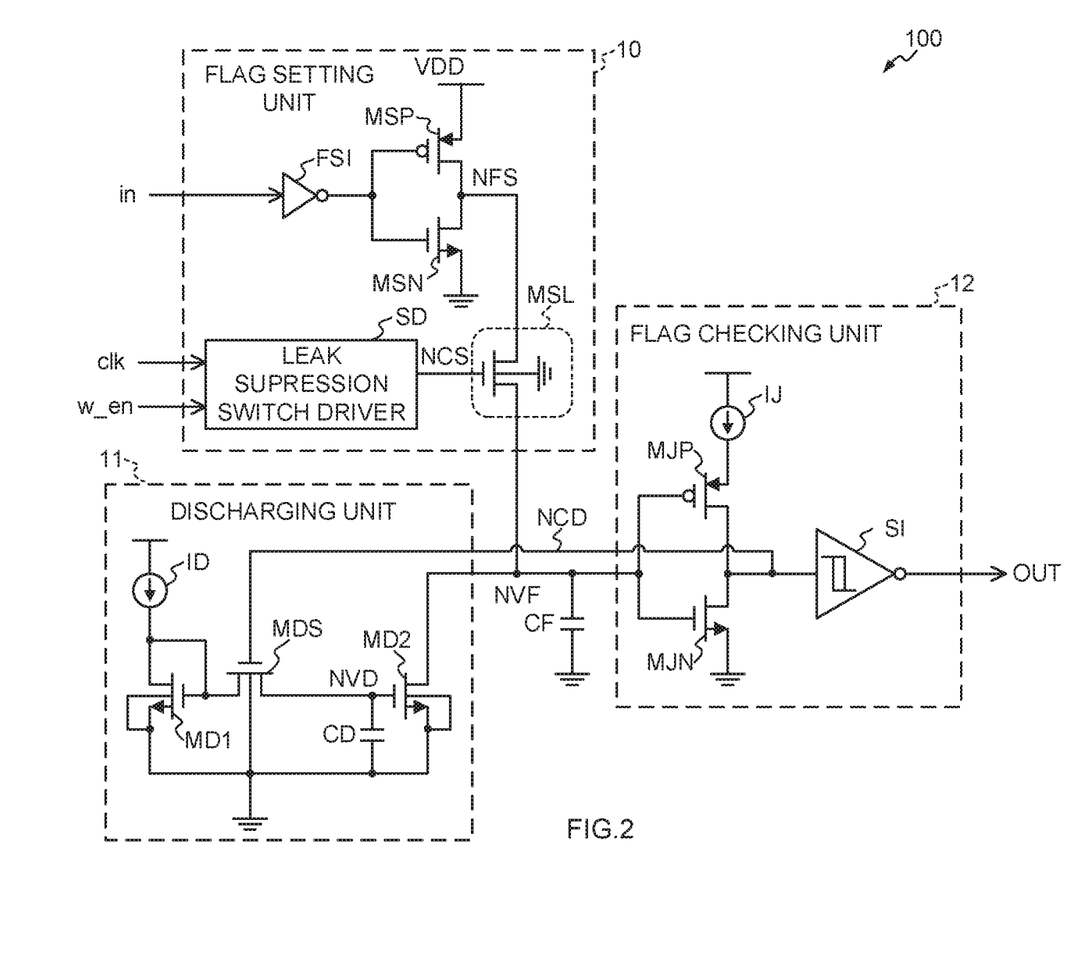
FIG. 2 is a circuit diagram showing the configuration of a flag retaining circuit of the present embodiment.

FIG. 2 is a circuit diagram showing the configuration of the flag retaining circuit 100 of the present embodiment. The flag retaining circuit 100 has a capacitance CF. The flag retaining circuit 100 receives the supply of an input signal in, a clock signal clk, and a control signal w_en from a logic circuit (not shown) so as to charge and discharge the capacitance CF and output as a flag of "0" or "1". As mentioned previously, only when the tag circuit including the flag retaining circuit 100 is located within a predetermined range from a reader/writer, electric power is supplied to the flag retaining circuit 100.

The flag retaining circuit 100 has the capacitance CF, a flag setting unit 10, a discharging unit 11, and a flag checking unit 12. The capacitance CF has one terminal connected to a node NVF that is a first connection line between the discharging unit 11 and the flag checking unit 12, and the other terminal grounded.

The flag setting unit 10 includes an inverter FSI, a transistor MSP, a transistor MSN, a leak suppression switch MSL, and a leak suppression switch driver SD.

The inverter FSI receives the supply of the input signal in from the logic circuit (not shown) and supplies a signal (hereinafter called an inverted input signal) obtained by inverting the logic level of the input signal in to the respective gates of the transistors MSP and MSN.

The transistor MSP is constituted by a P channel MOS transistor that is a first-conductivity-type MOS transistor. The source of the transistor MSP is connected to a power supply (power-supply voltage VDD). The transistor MSN is constituted by an N channel MOS transistor that is a MOS transistor of a second conductivity type opposite to the first conductivity type. The source of the transistor MSN is grounded. The drains of the transistors MSP and MSN are connected to each other and to a node NFS. The transistors MSP and MSN are controlled to be on or off according to the inverted input signal supplied to their gates.

The leak suppression switch MSL is constituted by, e.g., an N channel MOS transistor. The drain of the leak suppression switch MSL is connected to the drains of the transistors MSP and MSN via the node NFS. The source of the leak suppression switch MSL is connected to the node NVF. The back gate of the leak suppression switch MSL is grounded. In order to turn on the leak suppression switch MSL, a voltage greater than the power-supply voltage VDD, which is the maximum value of the drain-to-source voltage, needs to be supplied to its gate.

The leak suppression switch driver SD is a control circuit that controls the gate of the leak suppression switch MSL. The leak suppression switch driver SD receives the supply of the clock signal clk and control signal w_en from the logic circuit (not shown) and generates a leak control signal NCS so as to supply the leak control signal NCS to the gate of the leak suppression switch MSL.

Figure 3:
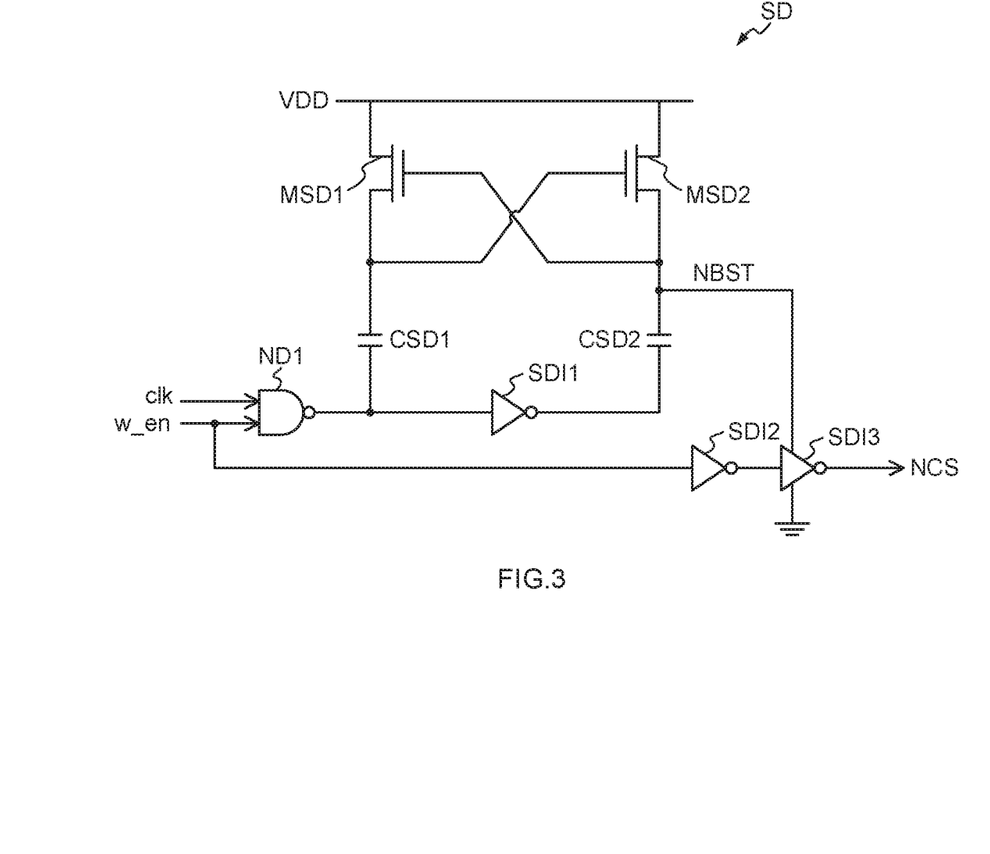
FIG. 3 is a circuit diagram showing the configuration of a leak suppression switch driver.

FIG. 3 is a circuit diagram showing the configuration of the leak suppression switch driver SD. The leak suppression switch driver SD is composed of, e.g., a transistor MSD1, a transistor MSD2, a capacitance CSD1, a capacitance CSD2, a NAND gate ND1, an inverter SDI1, an inverter SDI2, and an inverter SDI3.

The transistors MSD1 and MSD2 are constituted by, e.g., N channel MOS transistors. The sources of the transistors MSD1 and MSD2 are connected to the power supply (power-supply voltage VDD). The gate of the transistor MSD1 is connected to a node NBST. The drain of the transistor MSD2 is connected to the node NBST.

One end of the capacitance CSD1 is connected to the drain of the transistor MSD1 and to the gate of the transistor MSD2. The other end of the capacitance CSD1 is connected to the output of the NAND gate ND1 and to the input of the inverter SDI1.

One end of the capacitance CSD2 is connected via the node NBST to the gate of the transistor MSD1 and to the drain of the transistor MSD2. The other end of the capacitance CSD2 is connected to the output of the inverter SDI1.

The NAND gate ND1 has the clock signal clk and control signal w_en inputted thereto and outputs a signal of the negative AND of the clock signal clk and control signal w_en.

The inverter SDI1 has its input end connected to the output end of the NAND gate ND1 and to the other end of the capacitance CSD1. The inverter SDI1 inverts a signal supplied to the input end and supplies to the capacitance CSD2.

The inverter SDI2 has the control signal w_en inputted thereto and outputs a signal obtained by inverting the logic level of the control signal w_en.

The inverter SDI3 has the output signal of the inverter SDI2 (that is, the signal obtained by inverting the logic level of the control signal w_en) inputted thereto and outputs a signal obtained by inverting the logic level thereof as the leak control signal NCS. The positive power-supply terminal of the inverter SDI3 is connected to the node NBST, and the negative power-supply terminal is grounded. Thus, the leak control signal NCS is a signal having a signal level according to the potential on the node NBST.

Figure 4:
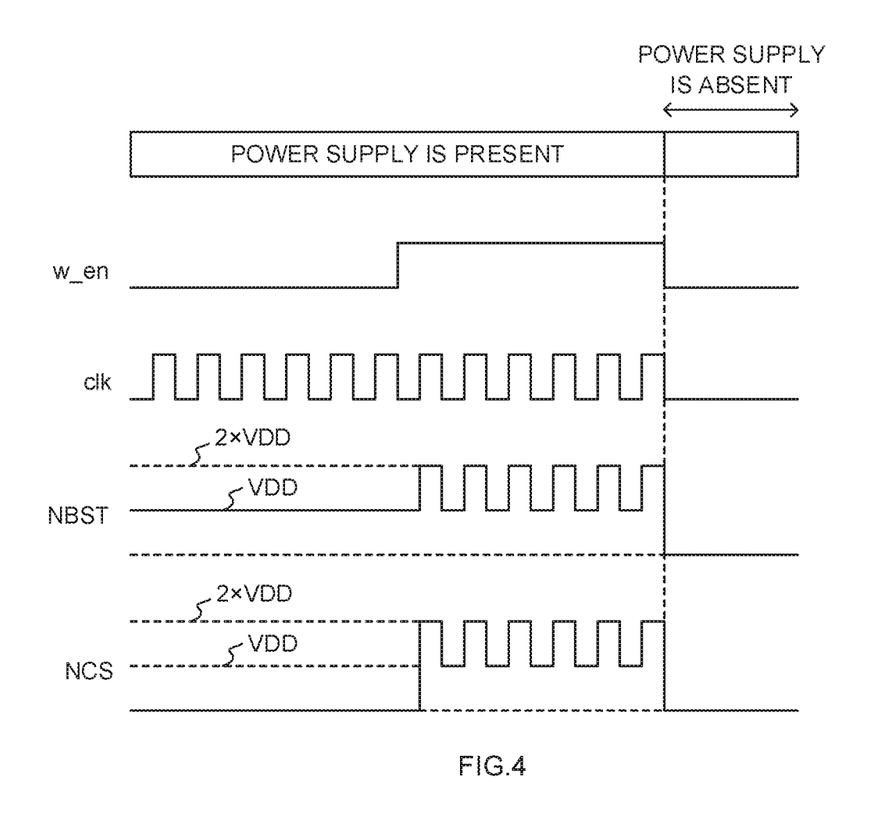
FIG. 4 is a time chart showing the operation of the leak suppression switch driver.

FIG. 4 is a time chart showing the operation of the leak suppression switch driver SD. When power supply is present, the clock signal clk is supplied to the NAND gate ND1. The control signal w_en is a signal whose signal level changes between "0" and "1" in logic level. The control signal w_en is a trigger signal of the control of the leak suppression switch MSL by the leak suppression switch driver SD.

During the time period when the control signal w_en is at a logic level "0" (that is, off), the capacitances CSD1 and CSD2 are charged up to the power-supply voltage VDD. Thus, the potential on the node NBST becomes a voltage level of the power-supply voltage VDD. The leak control signal NCS outputted from the inverter SDI3 is at the logic level "0", as is the control signal w_en, that is a signal level of ground potential.

When the control signal w_en becomes a logic level "1" (that is, on), the potential on the node NBST becomes a potential obtained by adding a signal which changes and the power-supply voltage VDD level synchronously with the clock signal clk to the potential of the power-supply voltage VDD level. That is, the potential level on the node NBST changes between VDD and 2×VDD at timings synchronous with the clock signal clk.

The leak control signal NCS outputted from the inverter SDI3 changes in signal level between VDD and 2×VDD synchronously with the clock signal clk. Thus, the leak control signal NCS whose signal level is at 2×VDD at a maximum is supplied to the gate of the leak suppression switch MSL, while the control signal w_en is on.

As such, the flag setting unit 10 is connected to the power supply (power-supply voltage VDD) and to the node NVF that is a first node and supplies the power-supply voltage VDD to the node NVF or cuts off power supply, based on the input signal in.

Referring again to FIG. 2, the discharging unit 11 includes a current source ID, a transistor MD1, a capacitance CD, a transistor MDS, and a transistor MD2.

One end of the current source ID is connected to the power supply. The transistor MD1 is constituted by an N channel MOS transistor. The gate and drain of the transistor MD1 are connected to the other end of the current source ID. The source and back gate of the transistor MD1 are grounded. The transistor MD1 converts the current made to flow by the current source ID into a direct-current voltage. The capacitance CD has one end connected to the node NVD and the other end grounded.

The transistor MD2 is a transconductance element to discharge the capacitance CF via the node NVF. The transistor MD2 is constituted by, e.g., an N channel MOS transistor. The source (that is, the first output end) and back gate of the transistor MD2 are grounded. The drain (that is, the second output end) of the transistor MD2 is connected to the node NVF. The gate (that is, the control input end) of the transistor MD2 is connected to the node NVD.

The transistor MDS is a control switch to control the input voltage of the transistor MD2. The transistor MDS is constituted by, e.g., an N channel MOS transistor. The source (that is, the first end) of the transistor MDS is connected to the node NVD. The drain (that is, the second end) of the transistor MDS is connected to the other end of the current source ID and to the gate and drain of the transistor MD1. That is, the drain of the transistor MDS is connected to the node at the direct-current voltage into which the current of the current source ID is converted by the transistor MD1. The gate (that is, the control end) of the transistor MDS is connected to a node NCD that is a second connection line between the discharging unit 11 and the flag checking unit 12. The back gate of the transistor MDS is grounded.

The flag checking unit 12 checks the flag based on the charge voltage of the capacitance CF. The flag checking unit includes a current source IJ, a transistor MJP, a transistor MJN, and a Schmitt inverter SI.

The transistor MJP is constituted by a P channel MOS transistor. The gate of the transistor MJP is connected to the node NVF. The transistor MJN is constituted by an N channel MOS transistor. The source of the transistor MJN is grounded. The gate of the transistor MJN is connected to the node NVF. The drains of the transistors MJP and MJN are connected to each other.

The current source IJ has one end connected to the power supply and the other end connected to the source of the transistor MJP. That is, the transistors MJP and MJN constitute a pair of transistors connected in series between the other end of the current source IJ and ground potential. The current source IJ fills the role of limiting the current value so that a large current does not flow through the transistor MJP.

The drains of the transistors MJP and MJN are connected to the input end of the Schmitt inverter SI. A feedback line (that is, the node NCD) is provided between the connection point between the drains of the transistors MJP and MJN and the input end of the Schmitt inverter SI, and the gate of the transistor MDS of the discharging unit 11.

The operation of the transistors MJP and MJN forming front-stage part of the flag checking unit 12 is determined according to the potential on the node NVF (that is, the charge voltage of the capacitance CF). For example, when the potential on the node NVF is near the power-supply voltage VDD, the transistor MJP is off while the transistor MJN is on, so that the node NCD is at an L level (that is, the ground level). When the potential on the node NVF is near to ground, the transistor MJP is on while the transistor MJN is off, so that the node NCD rises up to an H level (that is, the level of power-supply voltage VDD) due to the current source IJ.

That is, when the potential on the node NVF is near the power-supply voltage VDD, the transistor MJP is off while the transistor MJN is on, and the node NCD is at the L level. When the potential on the node NVF is near to ground, the transistor MJP is on while the transistor MJN is off, and the node NCD is at the H level.

As the potential on the node NVF gradually falls from near the power-supply voltage VDD, the transistor MJP goes from being off toward being on with the source-to-drain resistance decreasing while the transistor MJN goes from being on toward being off with the drain-to-source resistance increasing. When the current made by the current source IJ to flow through the transistor MJP becomes greater than the current flowing through the transistor MJN to ground, the node NCD changes from the L level to the H level.

The current flowing through the transistor MJP is limited by the current source IJ. Thus, even when the potential on the node NVF becomes an intermediate voltage between the power-supply voltage VDD and ground, a large short-circuit current does not flow through the transistors MJP and MJN.

The Schmitt inverter SI forms rear-stage part of the flag checking unit 12. The Schmitt inverter SI outputs an output signal OUT of the L level or the H level depending on the voltage level on the node NCD.

The Schmitt inverter SI is a Schmitt trigger inverter having a hysteresis characteristic in input and output. The Schmitt inverter SI has an input threshold voltage $Vth\_LH$ when the output voltage changes from the L (low) level to the H (high) level and an input threshold voltage $Vth\_HL$ when the output voltage changes from the H level to the L level (wherein $Vth\_HL > Vth\_LH$). Thus, even when the node NCD is at an intermediate voltage between the power-supply voltage VDD and ground, its output logic is determined, so that the state where a short-circuit current remains flowing can be avoided.

The voltage on the node NVF which causes the output signal OUT to change from the H level to the L level is a threshold voltage $Vth\_FL$ for flag checking. Thus, if power supply is present, and the voltage on the node NVF is greater than or equal to the threshold voltage $Vth\_FL$, then the node NCD is at the L level, and the output signal OUT is at the H level. And if power supply is present, and the voltage on the node NVF is less than the threshold voltage $Vth\_FL$, then the node NCD is at the H level, and the output signal OUT is at the L level. In contrast, if power supply is absent, regardless of the magnitude relation between the voltage on the node NVF and the threshold voltage $Vth\_FL$, the node NCD is at the L level, and the output signal OUT is at the L level.

Figure 5:
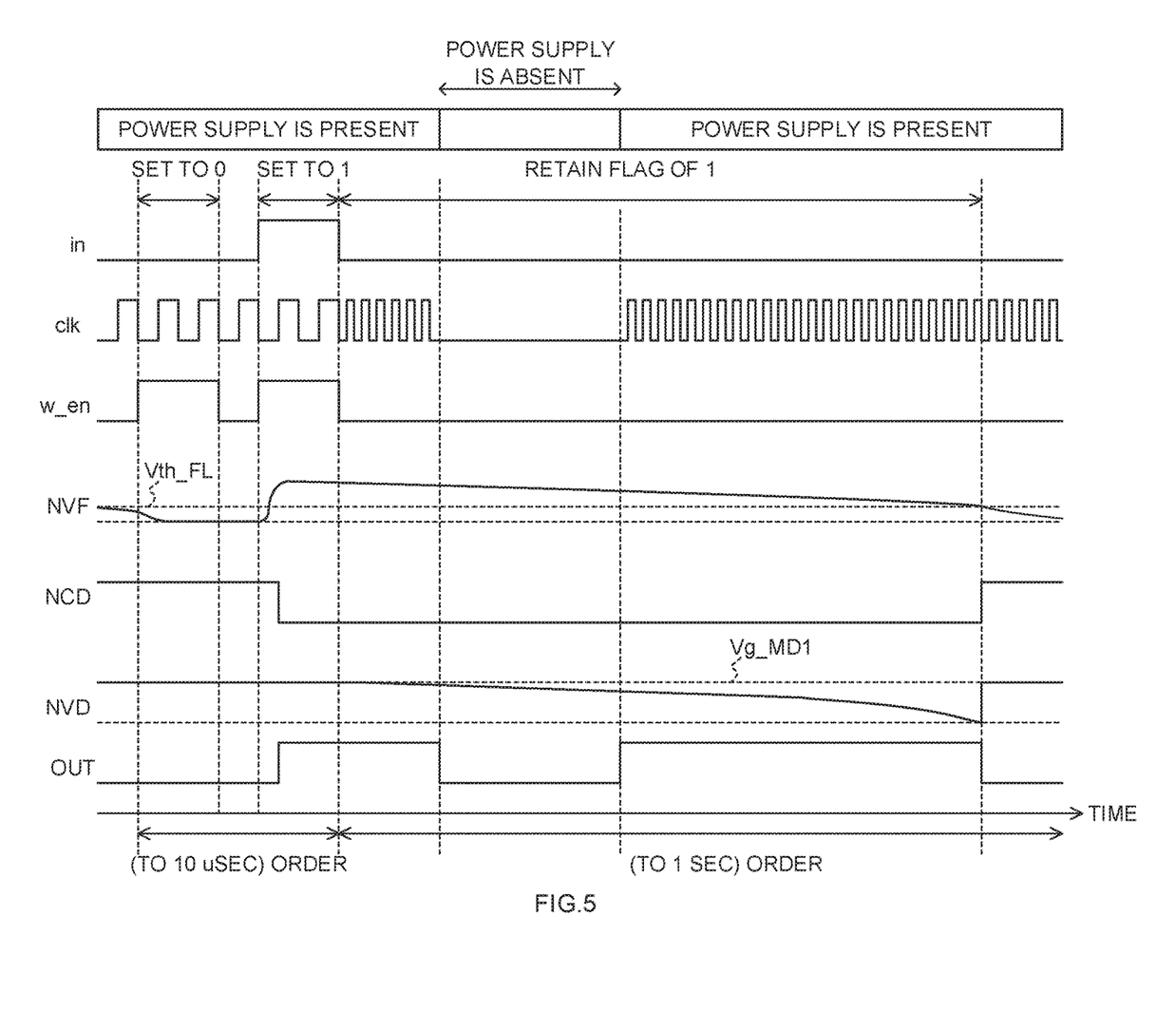
FIG. 5 is a time chart showing changes with time in input and output signals and in potential on inner nodes in the operation of the flag retaining circuit.

Next, the operation of the flag retaining circuit 100 of the present embodiment will be described with reference to the time chart of FIG. 5. In FIG. 5, the time period until "1" is written into the flag is shown on the order of "to 10 μsec", and the time period when the flag "1" is retained is shown on the order of "to 1 sec".

First, the flag retaining circuit 100 writes "0" into the flag in the state where power supply is present. The input signal in of the L level indicating "0" is supplied to the flag setting unit 10. A signal of the H level obtained by inverting the logic level of the input signal in is supplied to the gates of the transistors MSP and MSN, so that the transistor MSP becomes off while the transistor MSN becomes on. Thus, the node NFS is at a potential near to ground.

The clock signal clk and the control signal w_en of the H level are supplied to the leak suppression switch driver SD. In response to this, the leak suppression switch driver SD controls the leak suppression switch MSL to be on. When the leak suppression switch MSL becomes on, the capacitance CF is discharged, so that the potential on the node NVF becomes near to ground.

Since the potential on the node NVF is near to ground, the potential on the node NCD is at the H level (that is, power-supply voltage VDD level). The flag checking unit 12 outputs the output signal OUT of the L level (that is, ground level) which is the inverse level of the potential on the node NCD.

In the discharging unit 11, since the potential on the node NCD is at the H level (power-supply voltage VDD level), the transistor MDS is on. The potential on the node NVD becomes equal to the gate voltage $Vg\_MD1$ of the transistor MD1 determined by the current from the current source ID.

Then the flag retaining circuit 100 writes "1" into the flag in the state where power supply is present. The input signal in of the H level indicating "1" is supplied to the flag setting unit 10. A signal of the L level obtained by inverting the logic level of the input signal in is supplied to the gates of the transistors MSP and MSN, so that the transistor MSP becomes on while the transistor MSN becomes off. Thus, the node NFS is at a potential near the power-supply voltage VDD.

The clock signal clk and the control signal w_en of the H level are supplied to the leak suppression switch driver SD. In response to this, the leak suppression switch driver SD controls the leak suppression switch MSL to be on. When the leak suppression switch MSL becomes on, the capacitance CF is charged, so that the potential on the node NVF becomes near the power-supply voltage VDD.

Since the potential on the node NVF is near the power-supply voltage VDD, the potential on the node NCD is at the L level (that is, ground level). The flag checking unit 12 outputs the output signal OUT of the H level (that is, power-supply voltage VDD level) which is the inverse level of the potential on the node NCD.

In the discharging unit 11, since the potential on the node NCD is at the L level (that is, ground level), the transistor MDS is off. The capacitance CD has been charged up to the gate voltage $Vg\_MD1$ of the transistor MD1 determined by the current from the current source ID. Thus, the potential on the node NVD is at $Vg\_MD1$ as when "0" is written into the flag.

Then the flag retaining circuit 100 performs an operation of retaining the flag "1". This operation is the same between when power supply is present and when power supply is absent.

After the flag "1" is set, since the capacitance CF remains charged up to a voltage near the power-supply voltage VDD, the potential on the node NVF is near the power-supply voltage VDD. At this time, the transistor MJP is off, and the transistor MJN is on, so that the potential on the node NCD is at the L level (ground level). Since the potential on the node NCD is at the ground level, the transistor MDS is off. The node NVD has been charged up to the gate voltage Vg_MD1 of the transistor MD1 determined by the current from the current source ID, but is gradually discharged by a reverse leak current occurring through the parasitic diode of the transistor MDS.

Figure 6:
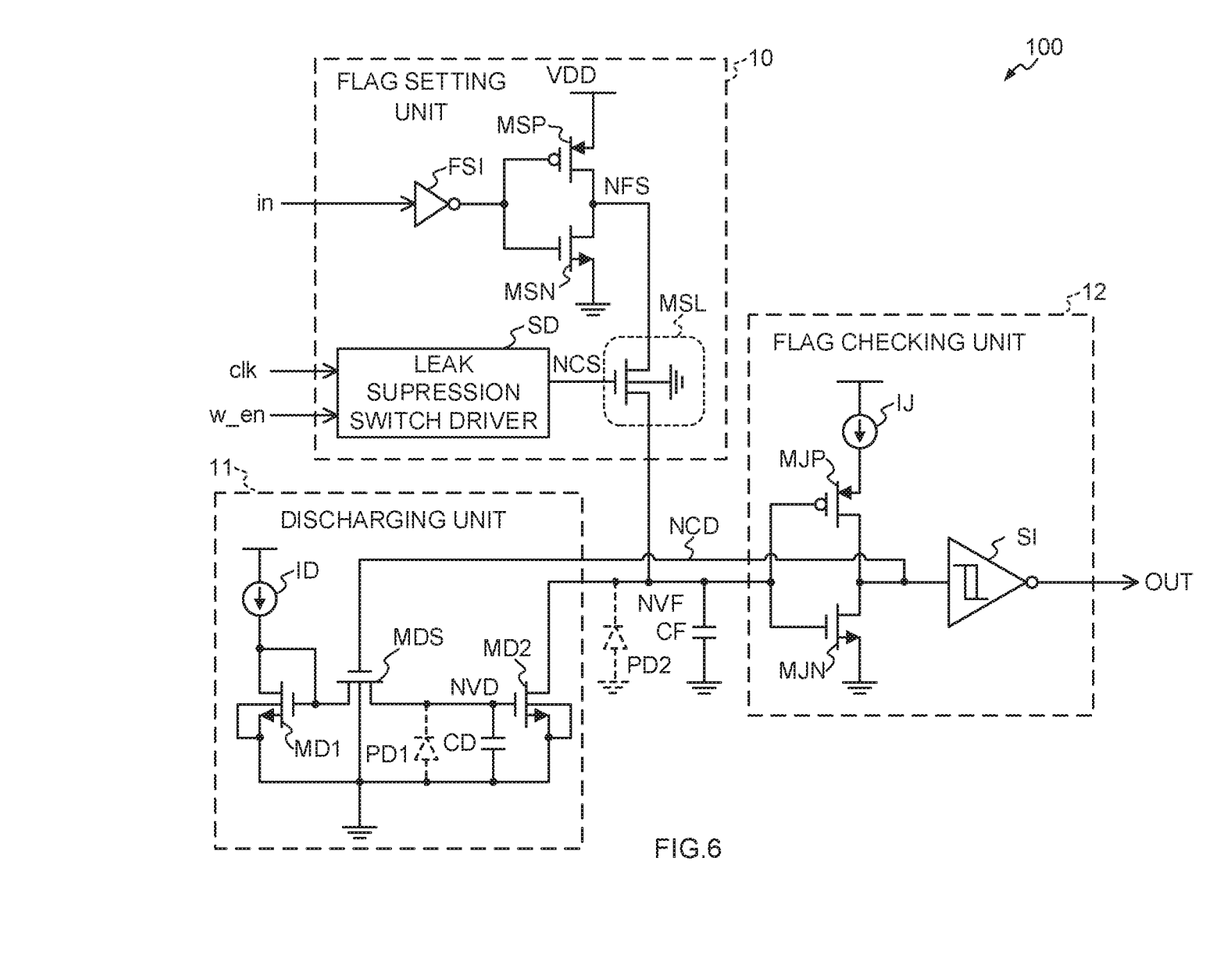
FIG. 6 is a circuit diagram showing the configuration of the flag retaining circuit with parasitic diodes.

FIG. 6 is a diagram showing schematically the parasitic diode PD1 of the transistor MDS. The parasitic diode PD1 occurs in parallel with the capacitance CD and between the node NVD and ground. The capacitance CD is gradually discharged by a reverse leak current occurring through this parasitic diode PD1, so that the potential on the node NVD gradually decreases.

The transistor MD2 converts the potential on the node NCD connected to its gate into the drain current. The current value of the converted drain current gradually becomes smaller as the potential on the node NVD decreases. The drain current of the transistor MD2 together with a reverse leak current occurring through the parasitic diode of the leak suppression switch MSL and of the transistor MD2 gradually discharges the capacitance CF.

The parasitic diode PD2 of the leak suppression switch MSL and of the transistor MD2 occurs in parallel with the capacitance CF and between the node NVF and ground as shown in FIG. 6. A reverse leak current occurring through this parasitic diode PD2 and the drain current of the transistor MD2 gradually discharge the capacitance CF, so that the potential on the node NVF gradually decreases.

Until the potential on the node NVF becomes lower than the threshold voltage Vth_FL for flag checking, the flag "1" is retained. The time period from when setting the flag "1" finishes to when the potential on the node NVF becomes lower than the threshold voltage Vth_FL for flag checking is the retention period of the flag "1".

The retention period of the flag "1" is determined by changes in the potentials on the node NVF, the node NCD, and the node NVD, which are three inner nodes of the flag retaining circuit 100. That is, the retaining operation of the flag "1" is completed by the three nodes NVF, NCD, and NVD.

During the retention period of the flag "1", one end of the capacitance CF, the source of the leak suppression switch MSL in an off state, the drain of the transistor MD2, the gate of the transistor MJP, and the gate of the transistor MJN are connected to the node NVF. And during that period, the potential on the node NVF gradually decreases.

Further, during the retention period of the flag "1", the drain of the transistor MJP in the off state, the drain of the transistor MJN in an on state, and the gate of the transistor MDS are connected to the node NCD. And during that period, the potential on the node NCD is at the L level (that is, ground level).

Yet further, during the retention period of the flag "1", one end of the capacitance CD, the source of the transistor MDS in the off state, and the gate of the transistor MD2 are connected to the node NVD. And during that period, the potential on the node NVD gradually decreases.

As such, the capacitance CD, the capacitance CF, the transistor MJP (which is the off state), the transistor MJN (which is the on state), the transistor MDS (which is the off state), the leak suppression switch MSL (which is the off state), and the transistor MD2 are involved in changes in the states (that is, changes of potential level) of the nodes. These elements are not directly connected to the power supply, and their states and operations (e.g., the drain current of the transistor MD2 determined by the charge voltage of the capacitance CD, and the charge voltage of the capacitance CF) are the same regardless of the presence or absence of power supply.

Figure 7:
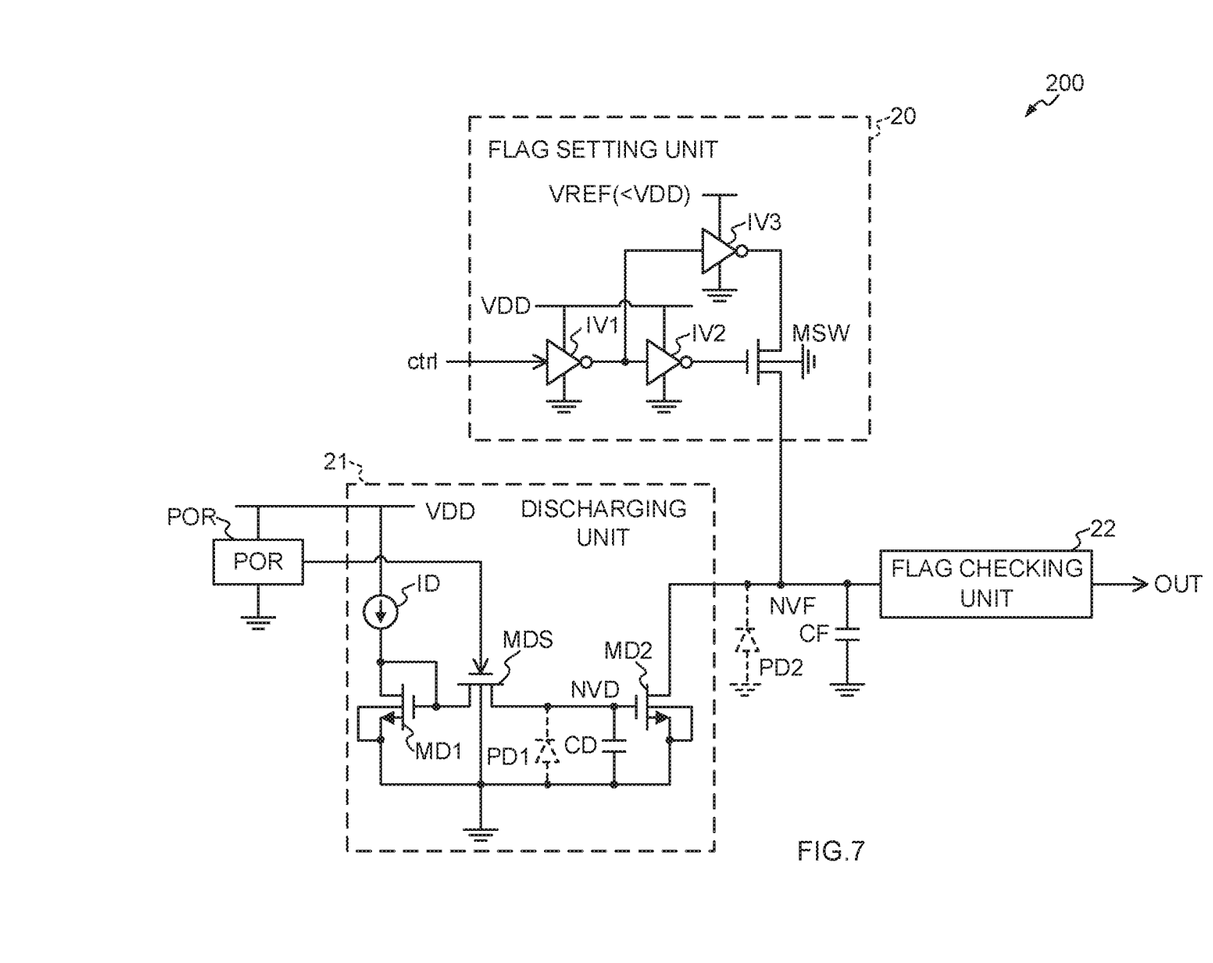
FIG. 7 is a circuit diagram showing the configuration of a flag retaining circuit as a comparison example.

FIG. 7 is a circuit diagram showing the configuration of a flag retaining circuit 200, as a comparison example, different from the flag retaining circuit 100 of the present embodiment.

A flag setting unit 20 of the flag retaining circuit 200 receives the supply of an input signal ctrl that is at the H level when the flag "1" is set. A signal obtained by shifting the signal level of the input signal ctrl to the power-supply voltage VDD level through inverters INV1 and INV2 having the power-supply voltage VDD as the operating voltage, is applied to the gate of a leak suppression switch MSW. At this time, a signal obtained by shifting the signal level of the input signal ctrl to a reference voltage VREF level through an inverter INV3 having the reference voltage VREF smaller than the power-supply voltage VDD as the operating voltage, is supplied to the drain of the leak suppression switch MSW. When the leak suppression switch MSW becomes on, the capacitance CF is charged up to the reference voltage VREF level.

A flag checking unit 22 compares the potential on the node NVF reflecting the charge voltage of the capacitance CF with a predetermined threshold voltage, thereby determining whether the flag is at "0" or "1".

A discharging unit 21 has a current source ID, a transistor MD1, a transistor MD2, a capacitance CD, and a transistor MDS. One end of the current source ID is connected to the power supply. The transistor MD1 is constituted by an N channel MOS transistor; the gate and drain thereof are connected to the other end of the current source ID; and the source and back gate thereof are grounded.

The transistor MD2 is constituted by an N channel MOS transistor; the drain thereof is connected to the node NVF; the gate thereof is connected to the node NVD; and the source and back gate thereof are grounded. The capacitance CD has one end connected to the node NVD and the other end grounded. The transistor MDS is constituted by an N channel MOS transistor; the source thereof is connected to the node NVD; the drain thereof is connected to the gate and drain of the MD1 and to the other end of the current source ID.

A power-on reset signal PR is supplied from a power-on reset unit POR to the gate of the transistor MDS. If power supply from a reader/writer to the tag circuit is present, the power-on reset unit POR applies a signal of the power-supply voltage VDD level as the power-on reset signal PR to the gate of the transistor MDS. If power supply from a reader/writer to the tag circuit is absent, the power-on reset unit POR applies a signal of ground level as the power-on reset signal PR to the gate of the transistor MDS. Thus, if power supply is present, the transistor MDS becomes on, and if power supply is absent, the transistor MDS becomes off.

Figure 8A:
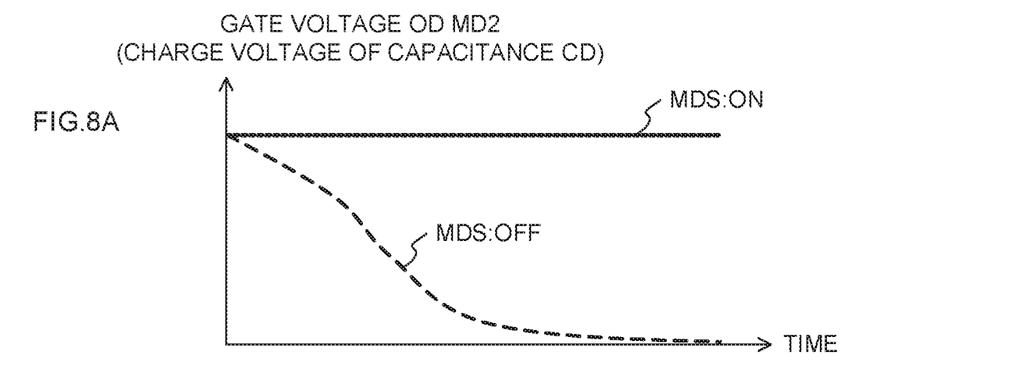
FIG. 8A is a graph showing schematically change with time in the input voltage of a transconductance element in the comparison example.

FIG. 8A is a graph showing change in the gate voltage of the transistor MD2 (that is, the charge voltage of the capacitance CD) for when the transistor MDS is on (that is, when power supply is present) and for when the transistor MDS is off (that is, when power supply is absent).

When the transistor MDS is on, the gate of the transistor MD2 is connected to the power supply via the transistor MD1 and the current source ID. Thus, the gate voltage of the transistor MD2 is constant. In contrast, when the transistor MDS is off, the gate of the transistor MD2 is cut off from the power supply. The capacitance CD is gradually discharged by a reverse leak current occurring through the parasitic diode PD1 of the transistor MDS.

Figure 8B:
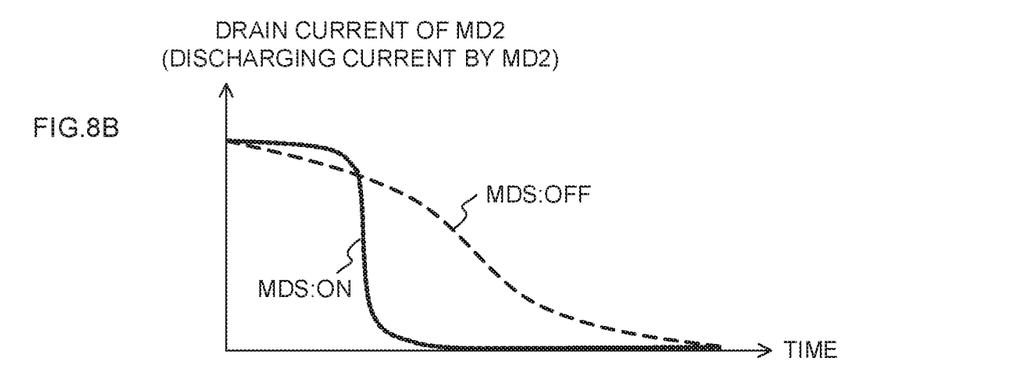
FIG. 8B is a graph showing schematically change in the current of the transconductance element in the comparison example.

FIG. 8B is a graph showing change in the drain current of the transistor MD2 (that is, the discharging current by the transistor MD2) for when the transistor MDS is on (that is, when power supply is present) and for when the transistor MDS is off (that is, when power supply is absent).

When the transistor MDS is on, the discharging current is nearly constant until the charge voltage of the capacitance CF comes close to zero. When the charge voltage of the capacitance CF comes close to zero, the discharging current sharply falls to zero. In contrast, when the transistor MDS is off, as the gate voltage of the transistor MD2 decreases due to the discharge of the capacitance CD, the discharging current gradually decreases.

Figure 8C:
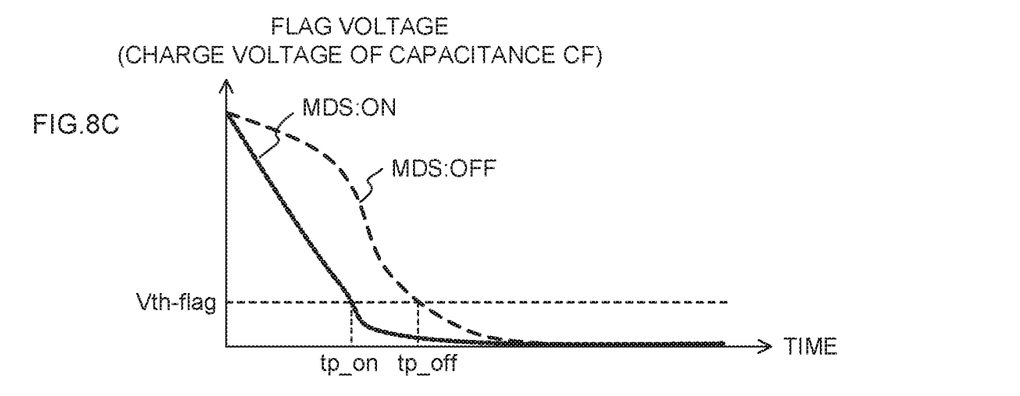
FIG. 8C is a graph showing schematically change with time in a flag voltage in the comparison example.

FIG. 8C is a graph showing change in the charge voltage of the capacitance CF (that is, change in a flag voltage) for when the transistor MDS is on (that is, when power supply is present) and for when the transistor MDS is off (that is, when power supply is absent).

The capacitance CF is discharged by the drain current of the transistor MD2 and a reverse leak current occurring through the parasitic diode of the leak suppression switch MSW and of the transistor MD2. When the transistor MDS is on, the drain current (that is, the discharging current) of the transistor MD2 is nearly constant, so that the rate of decrease in the charge voltage of the capacitance CF is nearly constant. In contrast, when the transistor MDS is off, as the drain current (that is, the discharging current) of the transistor MD2 gradually decreases, the rate of decrease in the charge voltage of the capacitance CF changes.

Thus, the timing when the charge voltage of the capacitance CF becomes lower than the threshold voltage Vth_flag for flag checking is different between when the transistor MDS is on and when off, and the timing when on (indicated as tp_on in FIG. 8C) is earlier than the timing when off (indicated as tp_off in FIG. 8C). That is, the retention period of the flag "1" is shorter when the transistor MDS is on than when off. Thus, the retention period of the flag is different between when power supply is present and when absent.

In contrast, as shown in FIG. 2, in the flag retaining circuit 100 of the present embodiment, the node NCD that is an inner node of the flag checking unit 12 is made to be connected to the gate of the transistor MDS of the discharging unit 11 (that is, feedback), so that the drain current (that is, the discharging current) of the transistor MDS is controlled by the charge voltage of the capacitance CF. That is, the discharging unit 11 discharges the capacitance CF based on the signal outputted from the flag checking unit 12 according to the charge voltage of the capacitance CF.

Thus, even when the capacitance CF has been charged up to a high charge voltage that the flag checking unit 12 determines to be "1", the operation is completed by only the transistor MJP (which is the off state), the transistor MJN (which is the on state), the transistor MDS (which is the off state), the leak suppression switch MSL (which is the off state), the transistor MD2, and the charge voltage of the capacitance CD (that is, the node NVD). Since none of these elements is directly connected to the power supply, the operation of the flag retaining circuit 100 is the same regardless of the presence or absence of power supply.

Thus, with the flag retaining circuit 100 of the present embodiment, because the operation (that is, the discharging current) of the discharging unit 11, which determines the retention period of the flag, is the same regardless of the presence or absence of power supply, the flag retention period can be made constant regardless of the presence or absence of power supply.

The present invention is not limited to the above embodiment. For example, the above embodiment describes the configuration where the Schmitt inverter SI is used in the rear-stage part of the flag checking unit 12 in order to avoid being in the state where a short-circuit current remains flowing when the node NCD is at an intermediate voltage between the power-supply voltage VDD and ground. However, the configuration of the rear-stage part of the flag checking unit 12 is not limited to this.

Figure 9:
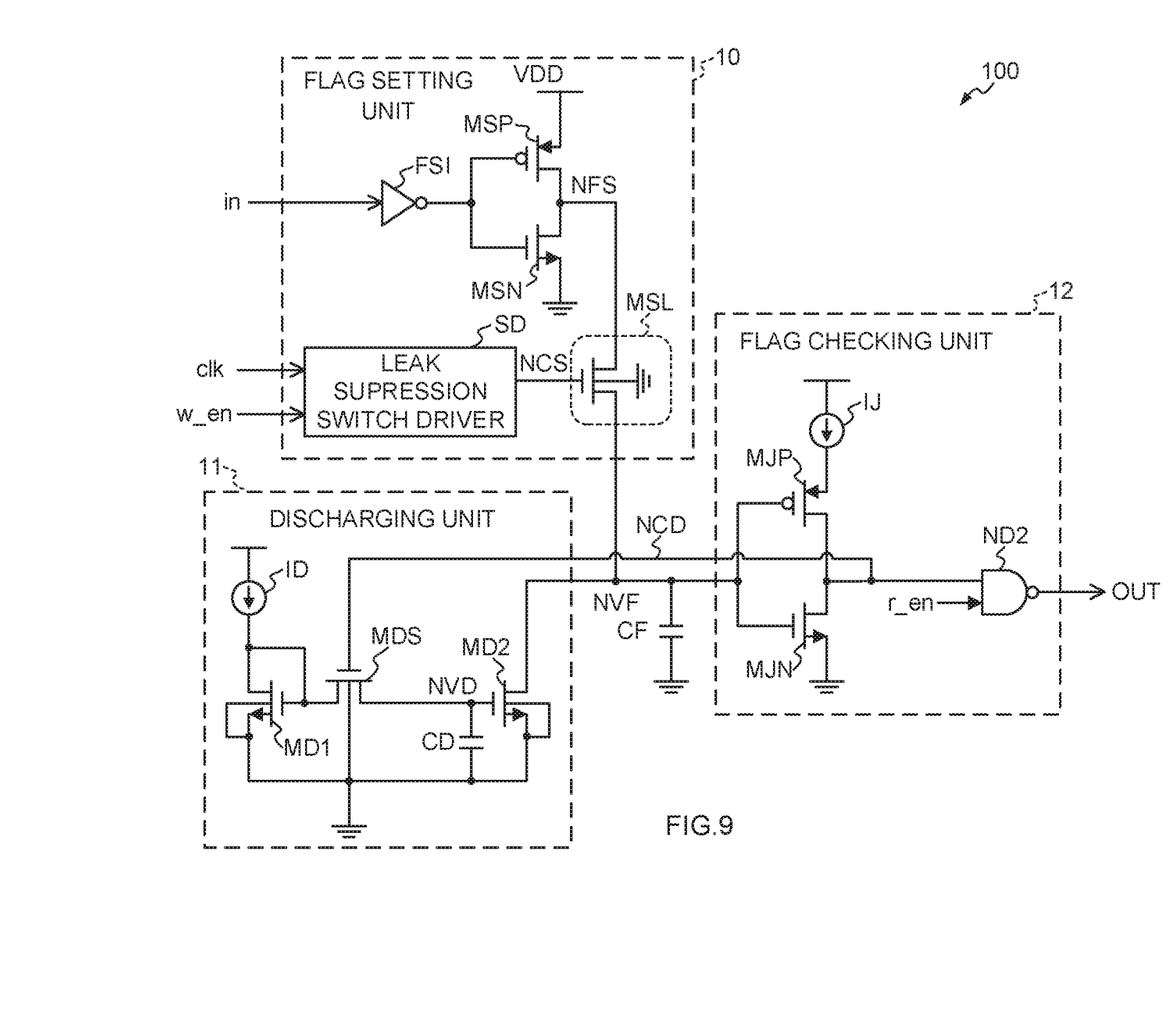
FIG. 9 is a circuit diagram showing the configuration of a modified-example flag retaining circuit.

FIG. 9 is a diagram showing the circuit configuration where a NAND gate ND2 is used in the rear-stage part of the flag checking unit 12. One of the input ends of the NAND gate ND2 is connected to the node NCD. An output control signal r_en is supplied to the other of the input ends of the NAND gate ND2.

The output control signal r_en is a signal which changes between the H level (that is, power-supply voltage VDD level) and the L level (that is, ground level). When the output control signal r_en is at the H level, the NAND gate ND2 outputs a signal obtained by inverting in logic the potential on the node NCD, as an output signal OUT. By this means, the voltage on the node NVF (that is, the charge voltage of the capacitance CF) is checked.

In contrast, when the output control signal r_en is at the L level, the NAND gate ND2 outputs a signal of the H level (that is, power-supply voltage level) as the output signal OUT regardless of the potential on the node NCD. That is, the flag checking unit 12 does not perform checking, and the output logic is fixed.

With this configuration, when the node NCD is at an intermediate voltage, the output logic is fixed by supplying the output control signal r_en of the L level, and, only when checking, the output logic can be released from being fixed by supplying the output control signal r_en of the H level.

Figure 10:
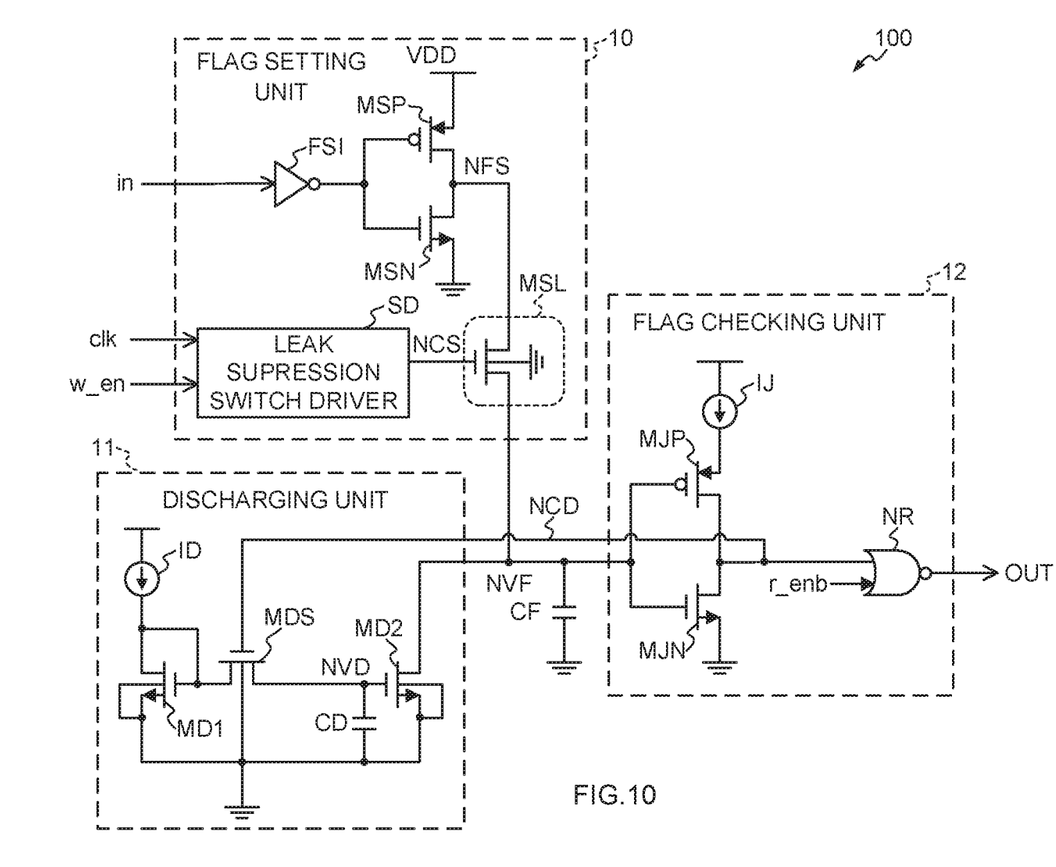
FIG. 10 is a circuit diagram showing the configuration of a modified-example flag retaining circuit.

FIG. 10 is a diagram showing the circuit configuration where a NOR gate NR is used in the rear-stage part of the flag checking unit 12. One of the input ends of the NOR gate NR is connected to the node NCD. An output control signal r_enb is supplied to the other of the input ends of the NOR gate NR.

The output control signal r_enb is a signal which changes between the H level (that is, power-supply voltage VDD level) and the L level (that is, ground level). When the output control signal r_enb is at the L level, the NOR gate NR outputs a signal obtained by inverting in logic the potential on the node NCD, as an output signal OUT. By this means, the voltage on the node NVF (that is, the charge voltage of the capacitance CF) is checked.

In contrast, when the output control signal r_enb is at the H level, the NOR gate NR outputs a signal of the L level (that is, ground level) as the output signal OUT regardless of the potential on the node NCD. That is, the flag checking unit 12 does not perform checking, and the output logic is fixed.

With this configuration, when the node NCD is at an intermediate voltage, the output logic is fixed by supplying the output control signal r_enb of the H level, and, only when checking, the output logic can be released from being fixed by supplying the output control signal r_enb of the L level.

With either of the configuration using the NAND gate ND2 (FIG. 9) and the configuration using the NOR gate NR (FIG. 10), by fixing the output logic except when checking the flag, a short-circuit current can be avoided while the output can be binarized, as when the Schmitt inverter SI is used as in the above embodiment. Further, these configurations are especially useful when the logic level toggling is not desired to be transmitted to the output side (that is, when a short-circuit current due to excess toggling is not desired to be occurred).

The above embodiment describes the case where the source of the leak suppression switch MSL constituted by an N channel MOS transistor is connected to the node NVF with the drain being connected to the NFS. However, either of the source and drain of the leak suppression switch MSL need only be connected to the node NFS with the other being connected to the node NVF.

The above embodiment describes the case where the drain of the transistor MDS is connected to the other end of the current source ID with the source being connected to the NVD. However, either of the source and drain of the transistor MDS need only be connected to the current source ID with the other being connected to the node NVD.

This application is based upon and claims the benefit of priority from the prior Japanese Patent Application No. 2018-099621 filed on May 24, 2018, the entire contents of which are incorporated herein by reference.

What is claimed is:

1. A flag retaining circuit in a tag circuit of RFID (Radio Frequency Identification) that receives power supply through radio waves from a reader/writer device, which transmits and receives information to and from said reader/writer device via near field communication, said flag retaining circuit retaining a flag having a value of 0 or 1 used in transmitting and receiving said information in response to flag setting action, comprising:
    a first capacitor element;
    a flag setting unit connected to a power source that supplies a power-supply voltage based on the power supply, for receiving supply of an input signal and charging said first capacitor element according to said input signal;
    a flag checking unit for outputting an output signal denoting 0 or 1 on the basis of a charge voltage across said first capacitor element; and
    a discharging unit for discharging said first capacitor element,
    wherein said first capacitor element is at one end thereof connected to a first line connecting said flag checking unit with said discharging unit, and at another end thereof grounded,
    wherein said discharging unit includes:
    a transconductance element having a first output end grounded and a second output end connected to said first line, for converting a voltage supplied to a control input end thereof into a current flowing between said first output end and said second output end so as to discharge said first capacitor element via said first line;
    a control switch having a first end thereof connected to a node at a direct-current voltage, a second end thereof connected to the control input end of said transconductance element, and a control end thereof connected to a second line connecting said flag checking unit and said discharging unit, for connecting to or disconnecting from said first end said second end depending on a voltage on said second line; and
    a second capacitor element at one end thereof connected to a node positioned between the control input end of said transconductance element and the second end of said control switch, and at another end thereof grounded, and
    wherein said flag checking unit outputs an inverse voltage obtained by inverting a voltage on said first line onto said second line.

2. The flag retaining circuit according to claim 1, wherein each of said transconductance element and said control switch is constituted by a MOS transistor, and
    wherein said transconductance element has a source which is grounded as said first output end, a drain which is connected to said first line as said second output end, and a gate which is connected to said control input end, and
    wherein said control switch is connected to the node at said direct-current voltage at one of a source and a drain thereof as said first end, connected to a gate which is the control input end of said transconductance element at another of the source and the drain thereof as said second end, and connected to said second line at a gate thereof as said control end.

3. The flag retaining circuit according to claim 1, wherein said flag checking unit includes:
    a first current source having one end connected to said power source; and
    a transistor pair of first and second transistors connected in series between the other end of said first current source and ground potential,
    wherein said first transistor is constituted of a MOS transistor having a first conductivity type, and is connected to another end of said first current source at a source thereof, connected to said first line at a gate thereof, and connected to said second line at a drain thereof, and
    wherein said second transistor is constituted of a MOS transistor having a second conductivity type which is opposite to said first conductivity type, and is grounded at a source thereof, connected to said first line at a gate thereof, and connected to said second line at a drain thereof.

4. The flag retaining circuit according to claim 1, wherein said discharging unit includes:
    a second current source having one end connected to said power source; and
    a third transistor constituted of a MOS transistor having the second conductivity type, which is connected to the other end of said second current source at a gate and a drain thereof and is grounded at a source and a back gate thereof,
    wherein one of the source and drain of said control switch is connected to said power source via said third transistor and said second current source.

5. The flag retaining circuit according to claim 1, wherein said flag setting unit includes a leak suppression switch constituted of a MOS transistor, and
    wherein said leak suppression switch is connected to said first line at one of a source and a drain thereof, connected to said power source or ground potential at another of the source and the drain thereof in accordance with said input signal, and controlled to be on when said first capacitor element is charged.

6. The flag retaining circuit according to claim 1, wherein said flag checking unit includes a Schmitt inverter having an input end connected to said second line,
    wherein said Schmitt inverter outputs said output signal based on results of comparing the charge voltage across said first capacitor element with first and second thresholds.

7. The flag retaining circuit according to claim 1, wherein said flag checking unit includes an output unit that outputs said output signal, wherein said output unit is constituted of a NAND gate which is connected to said second line at one of input ends thereof and receives supply of a control signal having a signal level of an H level or an L level at another of the input ends thereof.

8. The flag retaining circuit according to claim 1, wherein said flag checking unit includes an output unit that outputs said output signal, wherein said output unit is constituted of a NOR gate which receives supply of a control signal having a signal level of an L level or an H level at one of input ends thereof and is connected to said second line at another of the input ends thereof.

9. A flag retaining method to be executed by a flag retaining circuit according to claim 1, including:

a step of receiving power supply and said input signal supplied from said reader/writer device;

a step of charging said first capacitor element according to said input signal;

a step of outputting the output signal denoting 0 or 1 based on the charge voltage across said first capacitor element; and a step of discharging said first capacitor element according to change in a current flowing between said first output end and said second output end of said transconductance element.

10. A semiconductor circuit comprising:

a flag setting unit which is connected to a power source and to a first node, and for supplying a power-supply voltage generated by the power source to said first node or cutting off supply of said power-supply voltage in accordance with an input signal;

a first capacitor element which is connected to said first node and is charged by said power-supply voltage;

a flag checking unit which is connected to said first node, and for checking a flag based on a charge voltage across said first capacitor element; and a discharging unit which is connected to said first node, and for discharging said first capacitor element based on a signal outputted from said flag checking unit according to the charge voltage across said first capacitor element, wherein said discharging unit discharges said first capacitor depending on a voltage on a second node provided on a line connecting said flag checking unit and said discharging unit, and wherein said flag checking unit outputs an inverse voltage obtained by inverting a voltage on said first node onto said second node.

* * * * *